US006418352B1

(12) United States Patent
Ellis et al.

(10) Patent No.: US 6,418,352 B1
(45) Date of Patent: Jul. 9, 2002

(54) INTEGRATED MATERIAL MANAGEMENT MODULE

(75) Inventors: Raymond W. Ellis, Austin; Andrew S. Extine, San Antonio, both of TX (US); Bedford E. Hardee, Woodland Park; Michael R. Lemchak, Colorado Springs, both of CO (US); Michael C. Simmons, Orlando, FL (US)

(73) Assignee: Brooks Automation GmbH, Jena (DE)

( * ) Notice: Subject to any disclaimer, the term of this patent is extended or adjusted under 35 U.S.C. 154(b) by 0 days.

(21) Appl. No.: 09/207,957

(22) Filed: Dec. 9, 1998

Related U.S. Application Data

(60) Provisional application No. 60/069,034, filed on Dec. 12, 1997.

(51) Int. Cl.$^7$ .............................................. G06F 19/00
(52) U.S. Cl. ..................................................... 700/116
(58) Field of Search ................................. 700/121, 112, 700/113, 115, 116, 225, 228

(56) References Cited

U.S. PATENT DOCUMENTS

| 4,672,185 A | | 6/1987 | Sato et al. | |
| 4,888,473 A | | 12/1989 | Rossi et al. | |
| 4,930,086 A | * | 5/1990 | Fukasawa | 700/116 |
| 5,097,421 A | * | 3/1992 | Maney et al. | 700/113 |
| 5,237,322 A | * | 8/1993 | Heberle | 340/870.13 |
| 5,387,993 A | * | 2/1995 | Heller et al. | 359/155 |
| 5,389,769 A | * | 2/1995 | Yamashita et al. | 235/375 |
| 5,412,644 A | * | 5/1995 | Herberle | 370/445 |
| 5,536,128 A | | 7/1996 | Shimoyashiro et al. | |
| 5,701,330 A | * | 12/1997 | Lippmann et al. | 375/257 |
| 5,742,238 A | * | 4/1998 | Fox | 340/825.49 |
| 5,867,389 A | * | 2/1999 | Hamada et al. | 700/110 |

FOREIGN PATENT DOCUMENTS

| EP | 0 283 034 | 9/1988 |
| EP | 0 562 622 | 9/1993 |

* cited by examiner

*Primary Examiner*—Thomas Black
*Assistant Examiner*—Edward F. Gain, Jr.
(74) *Attorney, Agent, or Firm*—Perman & Green, LLP

(57) ABSTRACT

A module for use in a system for processing articles, in which the system includes a plurality of machine tools for processing articles, a pod for carrying the articles to be processed by the machine tools from one machine tool to another, a host processing controller associated with the machine tools for controlling the operation thereof, a robot connected to each machine tool for receiving a pod, opening the pod and for transporting the articles from within the pod into position on the machine tool for processing. An identification device is carried by the pod for identifying a particular pod and the articles carried in the pod. The module includes a single wire connection between the identification system, the host controller and the robot. The module has a microprocessor to identify the source of a signal and for routing the signal between the identification system and the host controller and between the host controller and the robot depending on its source.

17 Claims, 13 Drawing Sheets

INTEGRATED MATERIAL MANAGEMENT MODULE

CROSS REFERENCE TO RELATED APPLICATION(S)

This application claims the benefit of U.S. Provisional Application No. 60/069,034, filed Dec. 12, 1997, which is incorporated by reference herein in its entirety.

FIELD OF THE INVENTION

The present invention relates generally to the field of manufacturing systems, and more particularly to a stand alone unit or module used to facilitate the interface or communication between elements in a system for processing articles, such as semiconductor wafers.

COMPUTER PROGRAM LISTING APPENDIX

Pursuant to 37 C.F.R. §1.96(c), a computer program listing appendix incorporating features of the present invention is being submitted herewith on a compact disc in compliance with 37 C.F.R. §1.52(e), and is incorporated herein by reference in its entirety. The computer program listing appendix is being submitted on a compact disc labeled "Copy 1". A duplicate copy labeled "Copy 2" is also enclosed. The content and information contained on each disc is identical, the details of which are as follows:

Machine Format: IBM™-PC

Operating System Compatibility: MS-Window™ (LOTUS WordPro™)

File on CD:
   Name: 09_207_957Appendix1.18.02.lwp
   Size: 38.3 MB
   Date: Jan. 18, 2002

BACKGROUND OF THE INVENTION

The field of semiconductor wafer manufacturing has seen the development of technologies which minimize wafer contamination, thus maximizing yields, through the use of sealed pods or containers for transporting wafers to be processed from one processing tool to another and to and from storage areas. Access to the wafers within the containers is had through a standard mechanical interface (SMIF). For example, see U.S. Pat. No. 4,532,970. Fabrication systems using such pods have come to be known as SMIF fabs and the containers have come to be known as SMIF pods.

The system for processing wafers in a SMIF fab will typically include a SMIF pod for carrying the wafers, a machine or processing tool (having a processing controller—referred to as the "host") for processing the wafers, a robot which is connected to the machine tool for receiving the pod and for transporting the wafers from within the pod into position on the machine tool for processing, and an identification system to permit identification of a pod. The identification system will consist of an identifying tag on the pod, such as a bar code or RF transponder, and a reader. The type of reader will depend on the type of identifying tag.

In a typical existing installation the identification system would be connected to a Cell Controller which manages the process tools via a terminal server or similar hardware and then via separate connections to the robot at each tool port. In addition, the Cell Controller would be separately connected with the process tools and their associated robots.

This arrangement is complicated since there are numerous tools within a fab and for each tool and its associated robot there are various data collection points for monitoring the environment and the articles being processed. Therefore a number of different data inputs is required. Currently, a separate computer is required to coordinate the collection of these inputs. In addition, for each of the numerous tools in a fab there is the problem of determining where to locate antennae, controllers and power supplies required to effect proper communication. Positioning of the antennae and other components significantly complicates the design of any fab.

Further, the use of an additional computer to effect communication requires means of interfacing with such computer and integrating with the various tools.

OBJECTS OF THE INVENTION

It is accordingly a principal object of the present invention to overcome the foregoing difficulties and disadvantages.

It is a specific object of the invention to simplify the current connection arrangement, discussed above, by providing a single wire interface between a process tool, the identification system, and the robot of that tool to the Cell Controller. Accordingly, this invention provides a module which includes a reader for reading the identification tag, and a micro circuit to provide a connection route between the identification system and the host, and between the host and the robot.

Another object of the invention is to provide a simplified connection using lower power consumption and modular design so that it can be easily installed.

Other objects, features and advantages of the present invention will be apparent from the description hereinafter.

SUMMARY AND BRIEF DESCRIPTION

In a semiconductor wafer processing system, the identification system could be of the typical RF reader and transponder type, or of a bar code type, or of an IR transceiver type. The robot could be of a well know structure for receiving the pod of wafers and moving the wafers into position where the process tool will have access to the pod for treating the wafers. The host can either be integral with the tool or may consist of a computer network for providing control and instruction to each of the tools.

In operation, the RF Reader of the identification system (or in the case of a bar code the optical reader, or in case of an IR system, the IR transceiver) would be mounted on or in the robot in such a manner as to permit reading the identification tag when the pod is properly placed on a receiving port of the robot. The tag will be read upon command of the host upon receipt of a message from the robot that a pod has been placed for processing. All messages and commands from the host via the present invention are simply passed to the proper recipient without respect to the contents of the message or command. The module of this invention does not provide message processing, only message routing. Once the host has determined that the pod is in position it will then communicate through the module to the robot to instruct the robot to begin its operation on the pod allowing the process tool access to the wafers. The module does not communicate directly with the pod or robot, either through the identification system or other means, and does not require any type of data storage or processing capability on the pod to facilitate additional process requirements of the wafers contained within the pod.

The present invention thus operates as a distribution system. It is capable of recognizing the source of information and routing it to the proper recipient. For example, the signal coming from the identification system would be routed to the host. Similar signals that may come from the robot to indicate that it has received the pod would also be routed to the host, and signals directed to the robot from the host to perform certain functions would be routed through the module.

The present invention uses lower power to effect communication, is faster and less expensive than current techniques, and is a stand alone module that can be easily installed in a variety of fabs. The use of this invention does not require reconfiguration of robots or tools and it can interface with many different existing robots produced by different manufacturers.

In addition to the foregoing, the present invention can interface with guided vehicles used in a fab for transporting wafer containers.

The foregoing and other features of the present invention are more fully described with reference to the following drawings annexed hereto.

DESCRIPTION OF THE PREFERRED EMBODIMENTS

With reference to the drawings, the following is a non-limiting description of various preferred embodiments of the invention.

Figure 1:
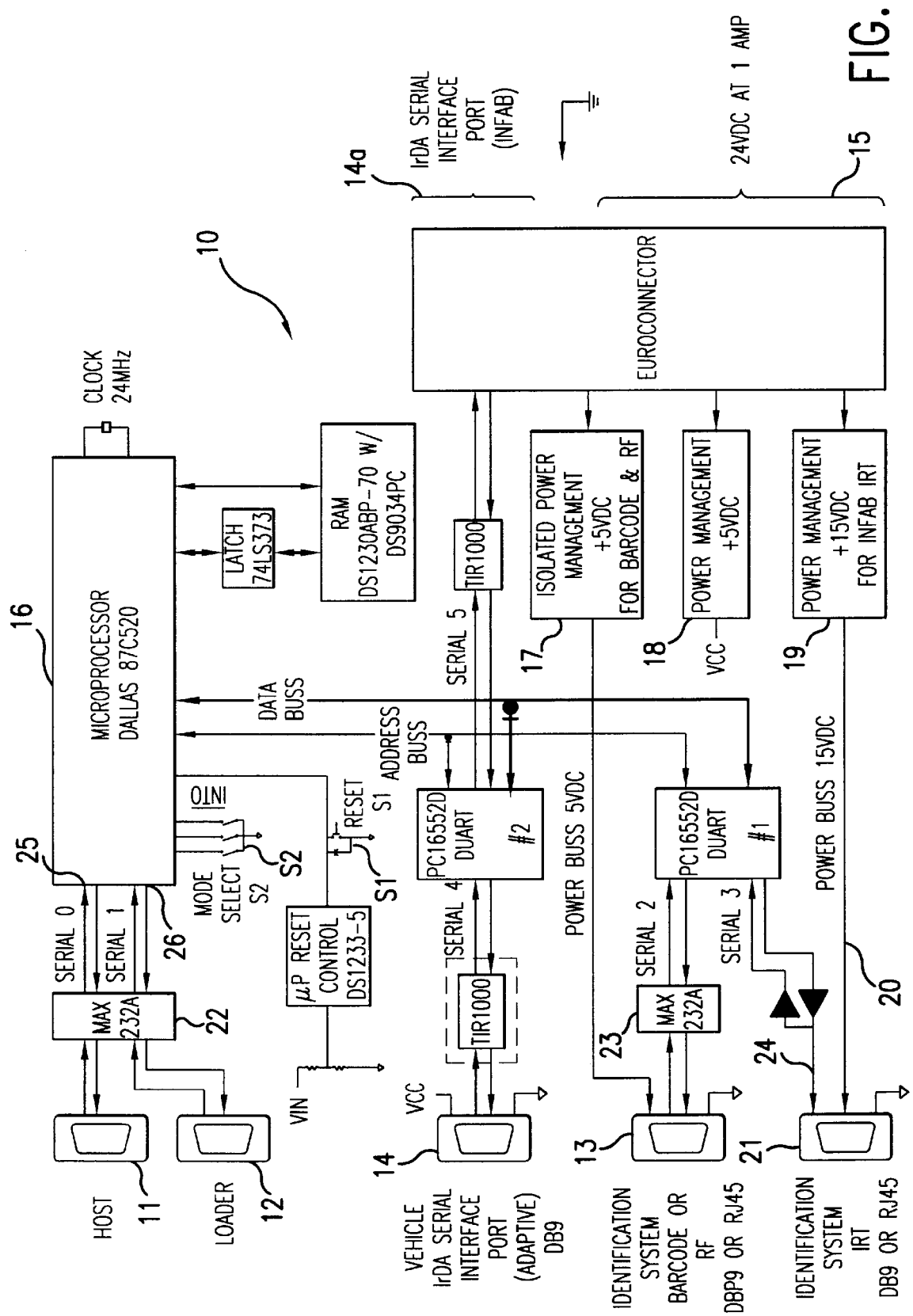
FIG. 1 is a hardware diagram of the functional blocks of a circuit card assembly for a microcomputer based module according to the present invention.
Figure 2:
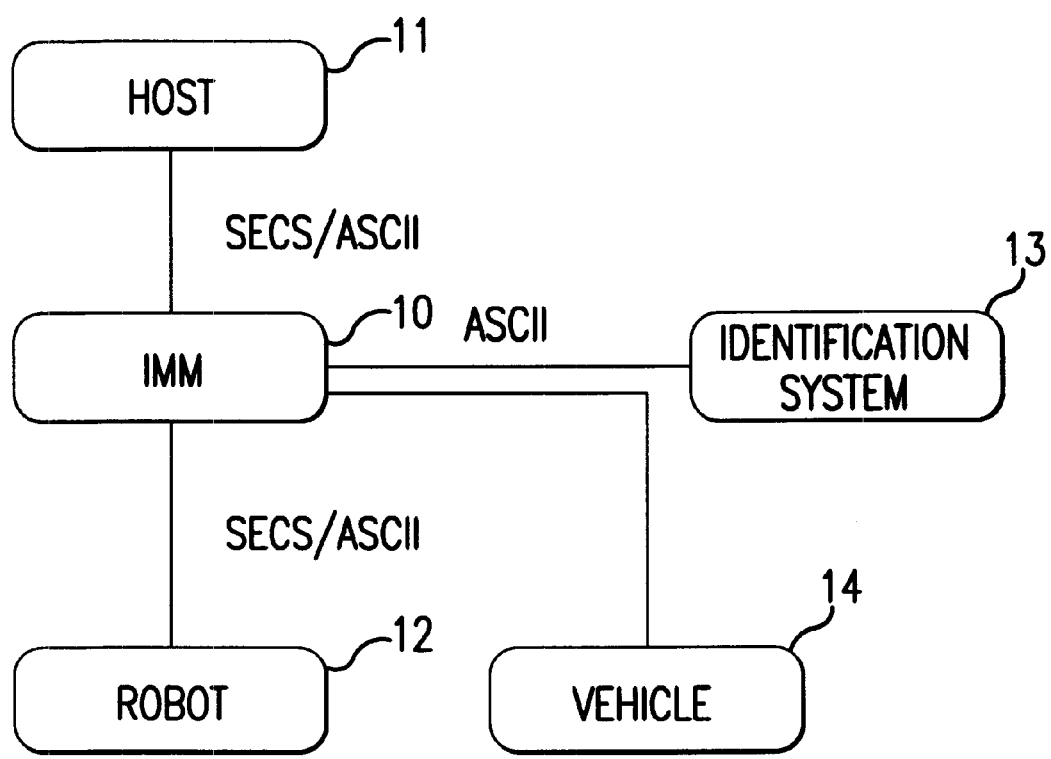
FIG. 2 shows the connection of the integrated material management module of the present invention with existing hardware components.
Figure 3:
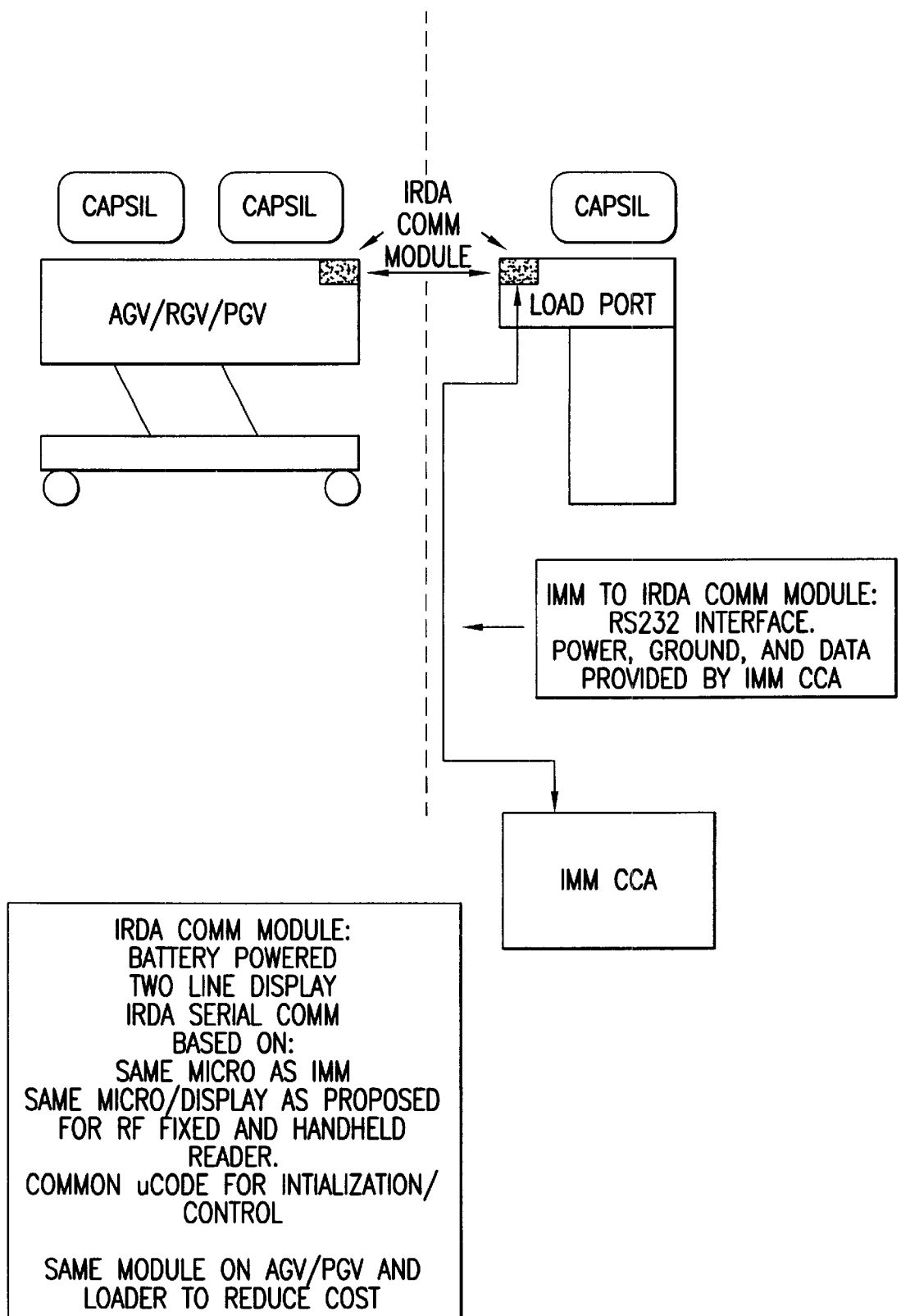
FIG. 3 shows the communications link for a guided vehicle.

FIG. 1 shows the functional blocks of a circuit card assembly 20 (or CCA) for a microcomputer based Integrated Material Management Module (IMM) 10. FIG. 2 shows that the IMM module 10 provides the connection with an existing host-robot-vehicle-identification message stream.

Because the technology herein is equally suitable for processing products of types different than semiconductor wafers, the semiconductor industry is hereinafter discussed for illustrative and descriptive purposes, and the term "wafer" is used hereinafter to designate material, or an article, of any equally suitable product. With this is mind, several different embodiments of the invention will be described.

Referring to FIG. 1, in different preferred embodiments of the invention, the host 11 could be a Manufacturing Execution System (MES) such as the "Factory Works" product produced by FASTECH, Inc. or the host could be an Equipment Set Controller (ESC) possibly based on the Tool Object Model (TOM) or the host could be the tool, itself.

In different preferred embodiments of the invention, the robot 12 could also be an elevator or a loader. Still, referring to FIG. 1, in different embodiments of the invention, the identification system 13 could also be called a reader or a tracker and could be based on a system such as the Iridnet Advanced Tracking System sold by Jenoptik Infab, Inc. The delivery vehicle 14 could be a person guided Vehicle (PGV) or a Rail Guided Vehicle (RGV) or an Automated Guided Vehicle (AGV). In yet another embodiment, the delivery vehicle 14 may be absent, replaced with an operator's manual delivery of wafer carriers.

The IMM circuit card assembly 20 includes the following functional blocks:

Power Distribution, Management and Control

The CCA 20 is powered by a single 24 vdc source 15. This is then regulated to supply 5 vdc 18 for the logic components (microprocessor 16, memory, etc.); a separate 5 vdc supply 17 which is switched at a frequency greater than 200 khz (to avoid harmonic interference) for the barcode and radio frequency identification readers, and 15 vdc supply 19 for the Infrared Transceiver identificaiton reader 21. In addition, the circuit is provided with a reset control device to insure that upon the applicaiton of power or a device reset that all of the components are properly initialized to insure a deterministic state for program initialization.

Microprocessor and Memory

The high speed microprocessor 16 is provided with a read only memory (ROM) for the purpose of initialization, program maintenance, and program loading. In addition to the read only memory, random access memory for program storage and operation is provided in a non-volatile form, i.e. the memory contents are preserved in the absence of power. The design also provides a "mode selection" control where upon initialization the program can determine the communications protocol of the host system.

Communications

The design provides electrical communications interfaces to the host system 11 and to robotic loading devices 12 via industry standard RS232 serial interface 22. All interfaces to the host equipment, loading services, and reader are under program control.

Communications to the barcode and/or RF reader 13 is via an industry standard RS232 interface 23. This interface is configurable for data rate and other serial interface 22. Al interfaces to the host equipment, loading devices, and reader are under program control.

Communications to the barcode and/or reader 13 is via an industry standard RS232 interface 23. This interface is configurable for data rate and other serial interface parameters as required for the receiving device. Power for these devices is provided from the power management and distribution section. By providing power directly to the devices the proper power requirements can be maintained. In addition to the barcode and RF readers, communications support for an Infrared Transceiver 21 is provided. This device uses a non-standard serial communications methodology where a single wire 24 is used for both transmit and receive whereas in a standard RS-232 serial interface two wires are used—one for transmit and one for receive. In conjunction with this non-standard serial communications methodology the power requirements of the Infrared Transceiver are met by the power management and distribution design 19.

Power Up/Reset

Upon an initial power-up condition, a reset via switch S1, or a reset under microprocessor control, the microprocessor Reset Control circuit, maintains a reset state for approximately 350 milliseconds (ms) to allow power, the microprocessor, and external components to stabilize prior to initialization.

Bootstrap/Program Load

Upon expiration of the reset timer the microprocessor begins program and hardware initialization tasks. The "bootstrap" program first initializes the microprocessor 16 to local control from internal read only memory (ROM) to perform the hardware initialization of the serial port that is required for program load. Once the "loader"/loader serial port is initialized the bootstrap program checks the serial port to determine if a Device Transmit Ready (DTR) signal is present. The presence of a DTR signal indicates that the user/host intends to download a new or updated Operational Program. The absence of a DTR signal indicates that the existing Operational Program is to be executed. If the bootstrap program determines that the existing Operational Program is to be executed it executes a program code segment to enable the external memory device containing the Operational Program and program execution resumes with the Operational Program.

In the event that the bootstrap program detects that a new or updated Operational Program is to be loaded, control is passed to the program load routine which will then interface with the users terminal device to control the downloading and verification of the new/updated Operational Program. Upon completion of this process and the removal of the DTR signal and/or the users terminal device the microprocessor, under initial program control, will initiate a device reset to allow control to pass to newly installed Operational Program.

Mode Selection

The invention includes a discrete switch that allows selection of different modes of program operation by the Operational Program. Upon program initialization the Operational Program reads the microprocessor port that the mode control switch is attached to. After performing this function the Operational Program initializes to the proper mode and normal operation begins:

The following modes are supported by the design:

| Mode-0 | SECs Messaging with RF ID reader |
| Mode-1 | SECs Messaging with Barcode ID reader |
| Mode-2 | SECs Messaging with Infrared ID reader |
| Mode-4 | ASCII Messaging with RF ID reader |
| Mode-5 | ASCII Messaging with Barcode ID reader |
| Mode-6 | ASCII Messaging with Infrared ID reader |

Modes 3 and 7 are reserved for future use.

Below is a (1) System Overview; (2) a Hardware Overview; (3) a Software Overview; (4) a description of the Communication Control for a SECS Interface; and (5) Communication Control for an ASCII Interface.

In the following description, reference is made to code designations, identified and described in the "APPENDIX."

The APPENDIX also includes descriptions of S3F1 message processing; the RF ID Interface; the ID Port Handlers; the Serial Port Handlers; the Millisecond Timer Handlers; the Watchdog Timer Handlers; and the Executive Routine.

1. System Overview

With reference to FIG. 2, the integrated MaterialID System consists of an ID system 13, such as an RF ID system, and a specialized micro-controller interface that provides the connection with the existing host-robot (11-12) message stream. The micro-controller, or Integrated MaterialID Module (IMM), may be configured to accommodate either SECS or ASCII messages. The IMM 10 is positioned between the host 11 and the robot or elevator 12:

The IMM module 10 passes messages from the host 11 to the robot 12 and back, unless the message is a material id message from the host. When it receives a material id message, it intercepts the message, reads the material id from the ID system 13, and generates an appropriate response. Thus, the robot 11, IMM 10, and the ID system 13 together present an integrated material identification capability to the host through the single wire connected to IMM 10.

2. Hardware Overview

The Integrated MaterialID System hardware consists of a micro-controller-based IMM board, a separate RF ID system, and a power supply. The IMM is mounted in the robot controller card cage, and connections are made through the front panel. The RF ID system consists of an integrated RF transmitter and antenna, and is mounted on the base plate of the robot, next to the SMIF pod. It is connected to the micro-controller by a flexible cable that has an RS-232 interface and 5V power. The power supply is separate from both the micro-controller and the RF ID system, and is mounted in the robot chassis outside the card cage. Packaging the RF transmitter and antenna in a separate module from the micro-controller avoids introducing RF into the existing robot control system, and it provides the capability of reusing the RF ID system in other applications.

The IMM module uses an 8051 compatible Dallas 87C520 microprocessor. The microprocessor has two built-in serial ports 25 and 26, 16 Kbytes of one-time-programmable internal read only memory (EPROM), and 128 Kbytes of external data memory configured as non-volatile memory through the use of Lithium battery backup which affords up to 10 years of program memory retention. In addition to the built-in serial ports, two additional serial ports are available to supply communications to an Identification System using industry standard RS232 communications (such as bar-code or RF readers) 13, a propriety interface to support the Infra-red Transceiver (IRT) component 21 of Infab's IridNet Tracking System, and two additional ports (14 for the vehicle and 14a) to support IRDA infra-red serial communications for providing command and control communications for semiconductor wafer transport devices such as push carts, rail-guided vehicles, and automated guided vehicles in conjunction with and coordinating with future automated overhead transports systems used for placing semiconductor wafer carriers directly on the semiconductor workstations loadport.

The RF ID system uses a Texas Instruments TIRIS micro-reader (RI-STU-MRD1) and a 45 micro-Henry wire loop antenna. This reader was chosen for its small size, low power consumption, low radiated energy, and low cost. The entire unit is assembled as one external package, and it is connected to the micro-controller through an RS-232 interface. The connecting cable supplies regulated power (5V) as well.

Both the IMM and the RFID system are powered by a 5V linear power supply, separate from the robot power supplies. This was done to avoid possible interaction between the switching power supplies in the robot and the RF circuity, though in production it may prove desirable to use power directly from the robot control system.

3. Software Overview

Figure 4:
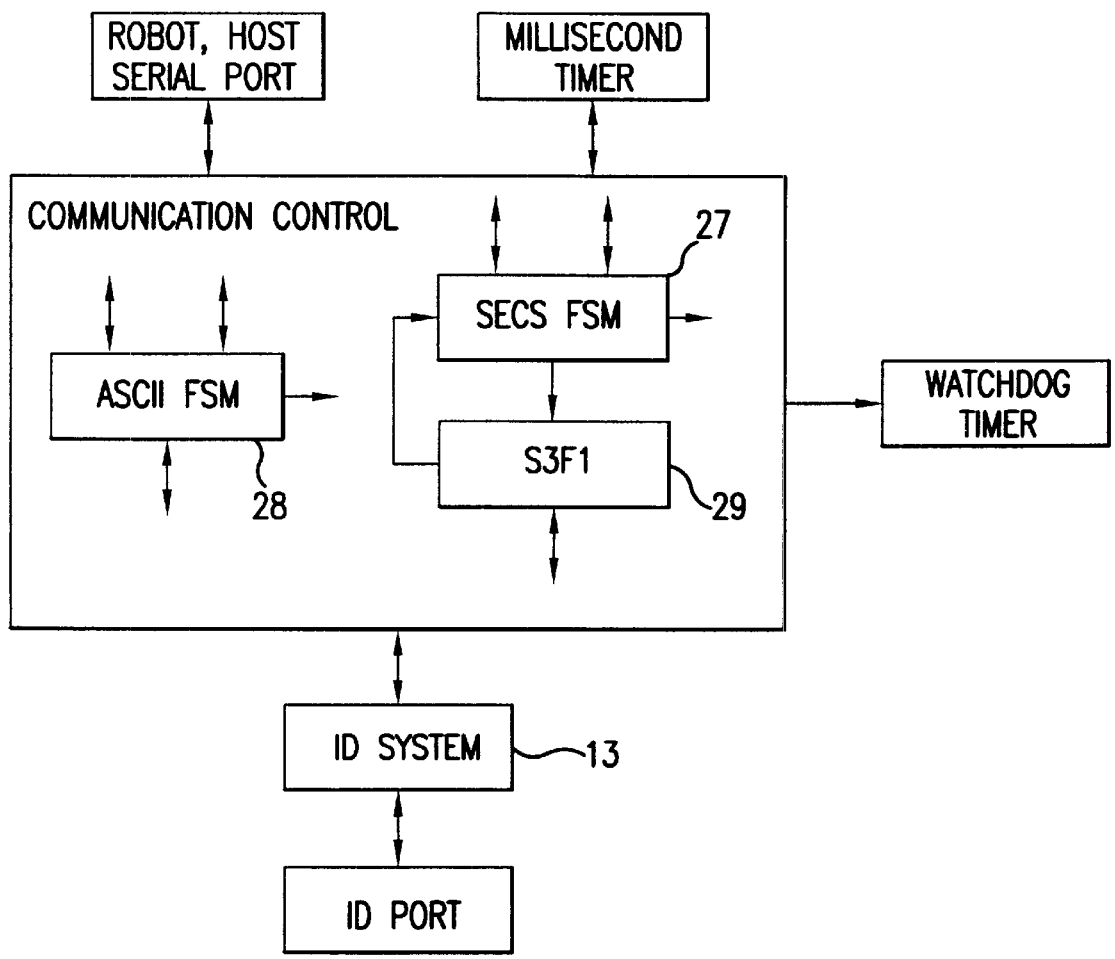
FIG. 4 is the overall software calling graph of the integrated material management module code.

The general structure of the IMM code is that of a communication controller state machine driven by events from the serial ports and the millisecond timer clock. The ID system is built as a layer on one of the serial ports. The finite state communication control may be configured to handle either SECS or ASCII messages (though not both at once!). Currently, this configuration is done through conditional compilation which controls the initialization code, though in production except for initialization takes place at interrupt level; the background task in the executive does nothing. A hardware watchdog timer runs in the background and will reset the system if it appears to be hung. The overall calling graph (who calls whom) is depicted in FIG. 4.

In the SECS configuration, communication with the host and the robot is controlled by the SECS communication control module 27, a finite state machine that recognizees the ENQ-EOT-MSG-ACK sequence of SECS messages. Its primary purpose is to recognize and block S3F1 (Material Status Request) messages sent by the host, and to keep track of the state of the host-robot communication so that the IMM does not attempt to send a reply in the middle of a host-robot conversation. Incoming SECS messages are buffered, and if the message is an S3F1, it is processed in the S3F1 module 29, which invokes routines from the ID system 13. The ID system starts an RF system read, detects completion, and invokes a callback routine in the S3F1 module 29 to generate the S3F2 (Material Status Data) response.

In the ASCII configuration, all message processing takes place in the ASCII communication control module 28. This is a small finite state machine that follows the ASCII communication protocol documented in the various Infab service manuals. A message arriving from the host is read, buffered, and inspected to see whether it is a READID material id message. If it is not, the message is sent to the robot. The module then waits for a reply from the robot, buffers it, and sends it to the host. If the message from the host is a material id message, a request is made of the ID system to start a read. When it completes, the ID system invokes a callback to send a READID reply to the host.

The files that compose the system are:

reg80c320.h exec.h/exec.c

SECS.h/SECS.c

S3F1.h/S3F1.c

ASCII.h/ASCII.c

IDSys.h/IDS.ys.c

IDPort.h/IDPort.c msTimer.h/msTimer.c wd.h/wd.c serialPorts.h/serialPorts.c and they are generated from their respective .html files.

4. Communication Control for SECS Interface

The communication control module is command center for IMM activity. Its general purpose is to pass messages back and forth from the host to the robot and back, intercepting and acting on material ID requests. It must recognize a material ID request, so that it can initiate a read from the ID system; and it must recognize when the host and robot are engaged in communication, so that it does not attempt to send the reply to a material ID request in the middle of their conversation.

Design Considerations

Two general approaches to solving this problem were considered. One was to buffer the SECS-I message in the IMM and forward it to its.final destination only after the entire message had arrived and checked. At first this appeared to be a simple, straightforward approach, but it introduces complicated problems trying to simulate the behavior of the normal host-robot system in failure situations. For instance, what if the IMM receives a message from the host, and then discovers that the robot is not responding? How can it notify the host? Without the IMM, the host would know immediately that the robot was down: the robot would not even respond to the ENQ-EOT line negotiation protocol. The IMM responded before it even discovered the robot was down, though, so the host will be confused.

The approach adopted in the IMM, however, is to forward the message a byte at a time, as soon as it arrives. This requires almost no buffering at all, and the host and robot can maintain an accurate picture of status of the link, as if there were no IMM at all. Keeping track of the status of the communication link, however, is somewhat more complex. We divide message traffic into robot-initiated, host-initiated, and IMM-initiated messages, and discuss them below.

Message from Robot

Figure 5:
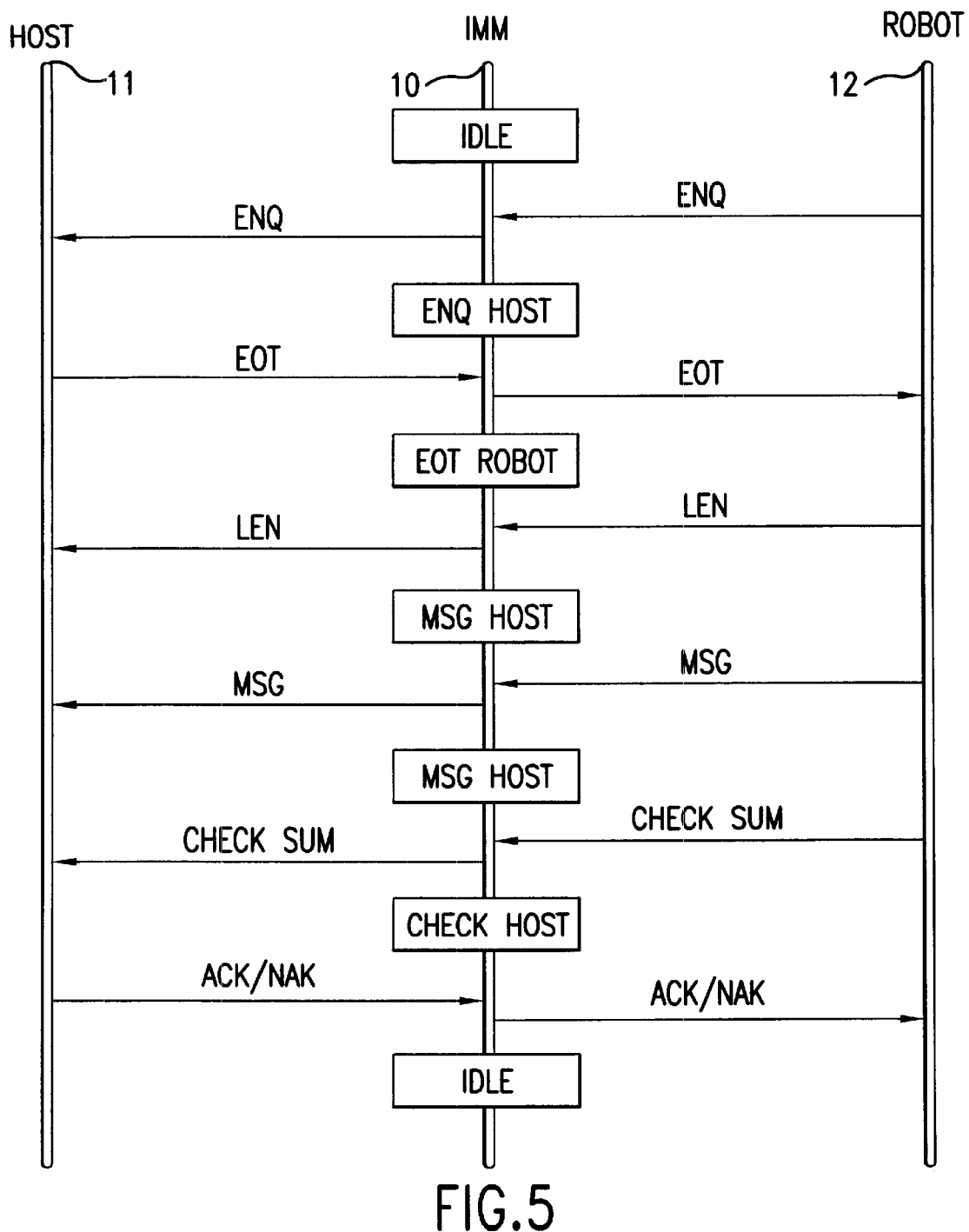
FIG. 5 shows the message traffic for a robot to host communication scenario.

Consider the case of a message from the robot for the host. Perhaps it is the response to a host inquiry, or an event report directed to the host. The message traffic for this scenario is depicted in FIG. 5

Figure 6:
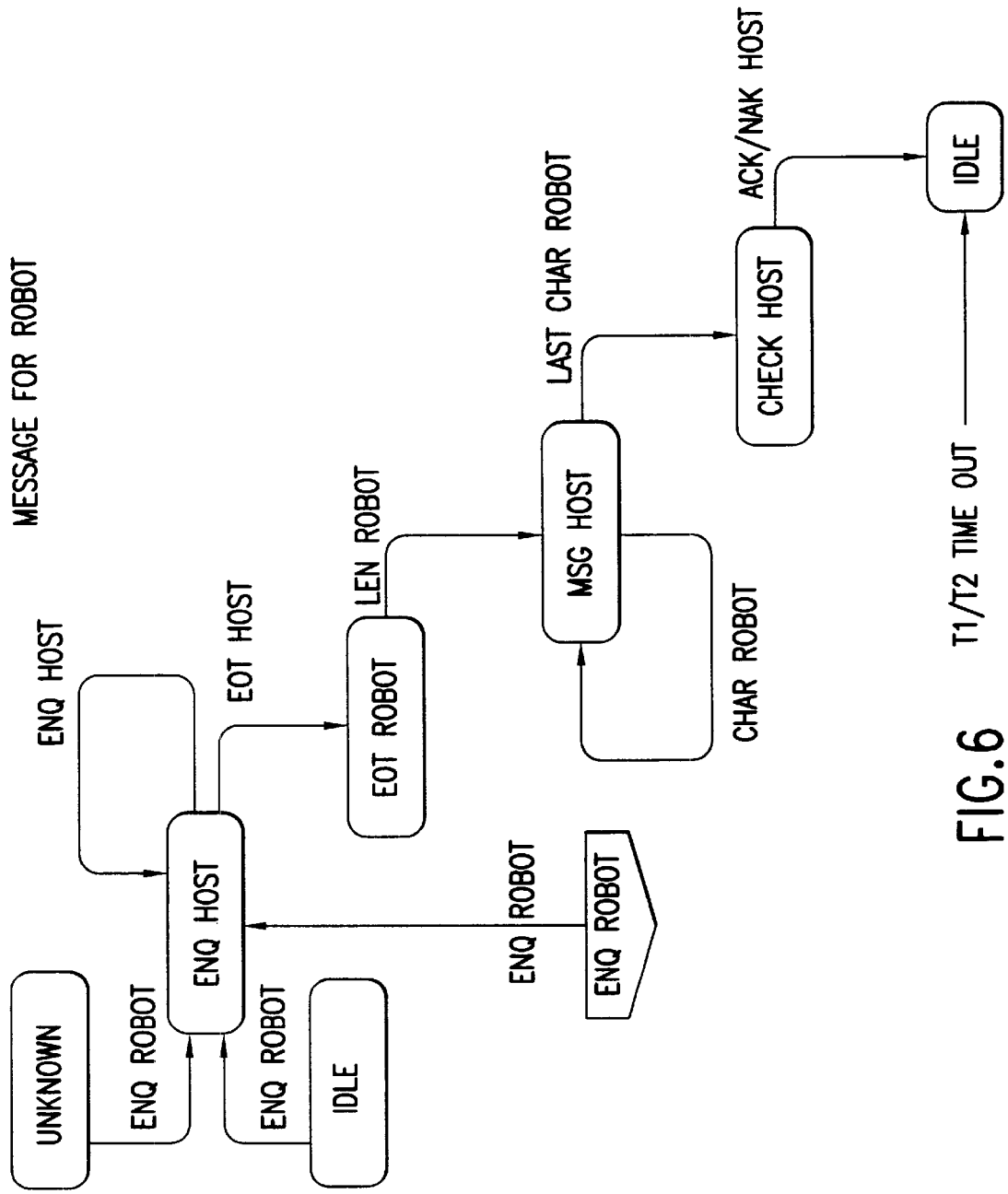
FIG. 6 is the state diagram associated with a message from the robot to the host for SECS interface.

MSG is just a shorthand for the stream of bytes that make up the message—each byte of the message is still forwarded as soon as it arrives. The boxes along the IMM line show the state of the communication controller, which allows it to recognize when the host-robot link is idle. The complete state diagram associated with a message from the robot to the host is shown in FIG. 6.

Note the contention resolution (state ENQ__robot transitioning to ENQ__host upon receiving an ENQ from the robot), which occurs if both the host and the robot attempt to initiate a conversation at once. Note, also, that all timeouts return the controller to an IDLE state.

UNKNOWN state

Figure 7:
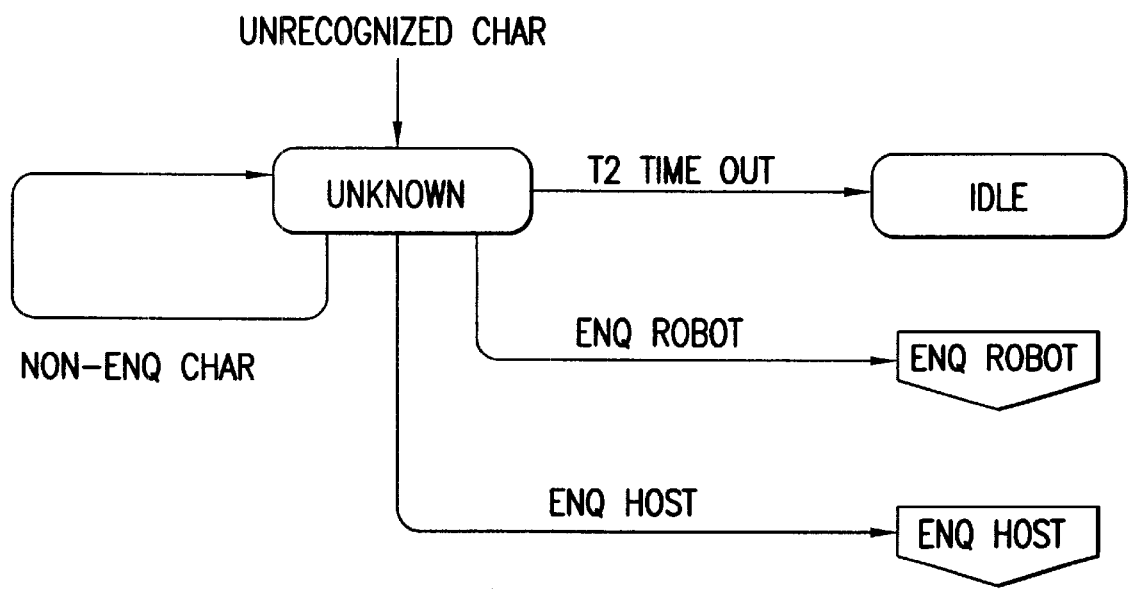
FIG. 7 shows how an unknown state is resolved.

FIG. 7 introduces the UNKNOWN state, the state the IMM starts in, and the state it returns to when it encounters an unexpected sequence of events. When the IMM is in the UNKNOWN state, it simply forwards every byte it receives, and tries to re-sync. It does not initiate any message of its own, lest it interrupt a host-robot conversation in progress. Although in normal message traffic this does not occur, if the host or the robot is restarted or a substantial interruption in the link to one of them occurs, an unintelligible sequence can result. This transitions the IMM into an UNKNOWN state, which is resolved as depicted in FIG. 7.

One basic starting point the IMM uses to recognize the status of the link is passage of time: if neither the host nor the robot have transmitted anything for a T2 period, it is safe to assume there is no conversation in progress and that the link is IDLE. The other starting point is the transmission of an ENQ. This is the start of a normal negotiation sequence, and the expected response is an EOT. If this does not occur (say one end was just re-started, and the other has not stumbled to the fact yet), the IMM re-enters the UNKNOWN state. If both the host the robot follow the SECS-I protocol, the IMM will eventually transition out of the UNKNOWN state. The use of an UNKNOWN state allows the IMM to accommodate the restart of the host or the robot (or the IMM) in a graceful way, to eventually recognize the state of the communication link between them, and not to interrupt the normal flow of message traffic while it is doing this.

Message from Host

Figure 8:
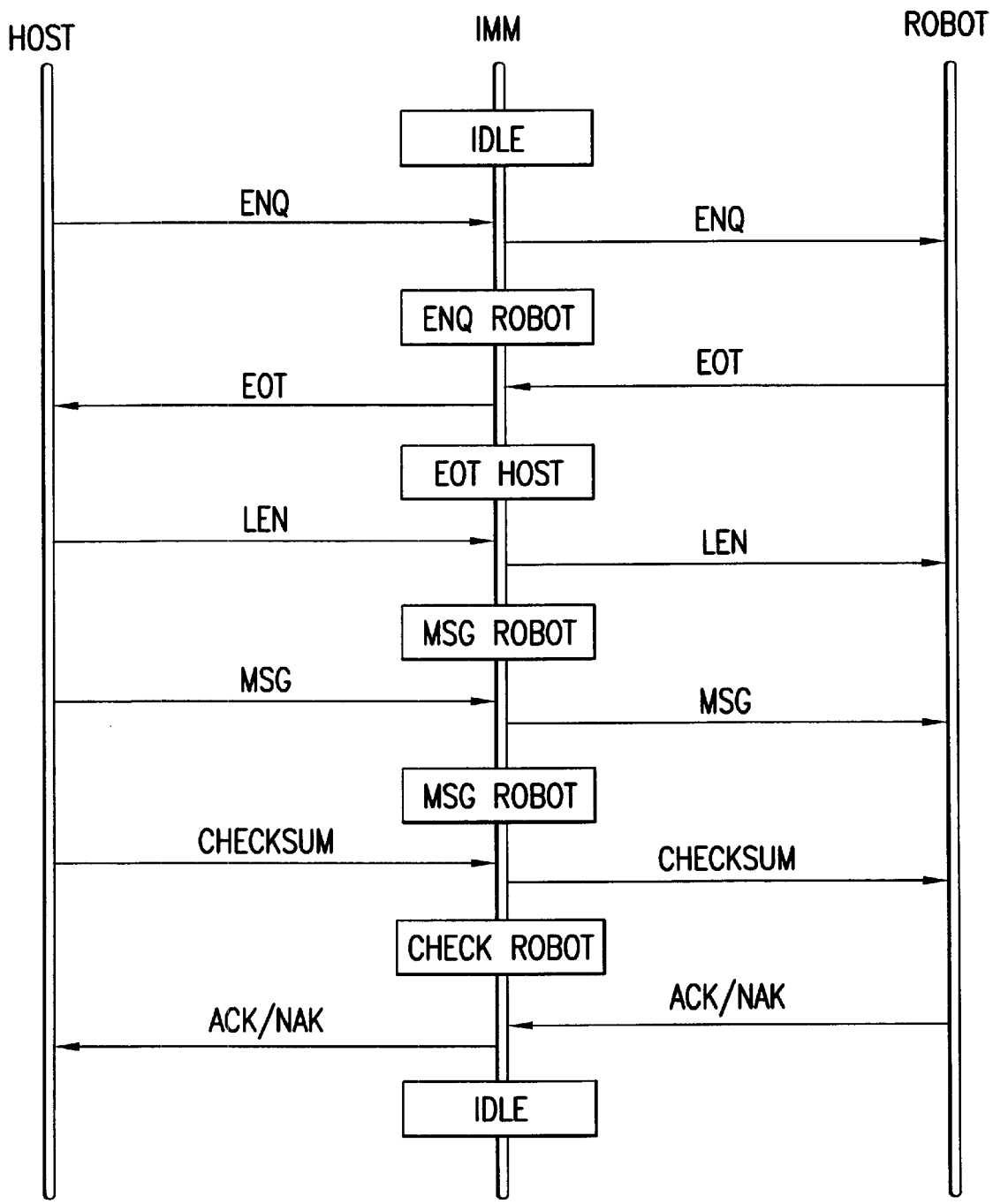
FIG. 8 shows the message traffic for a host to robot scenario.

Now the consider the case of a message from the host to the robot. The message traffic for this scenario is shown in FIG. 8.

Figure 9:
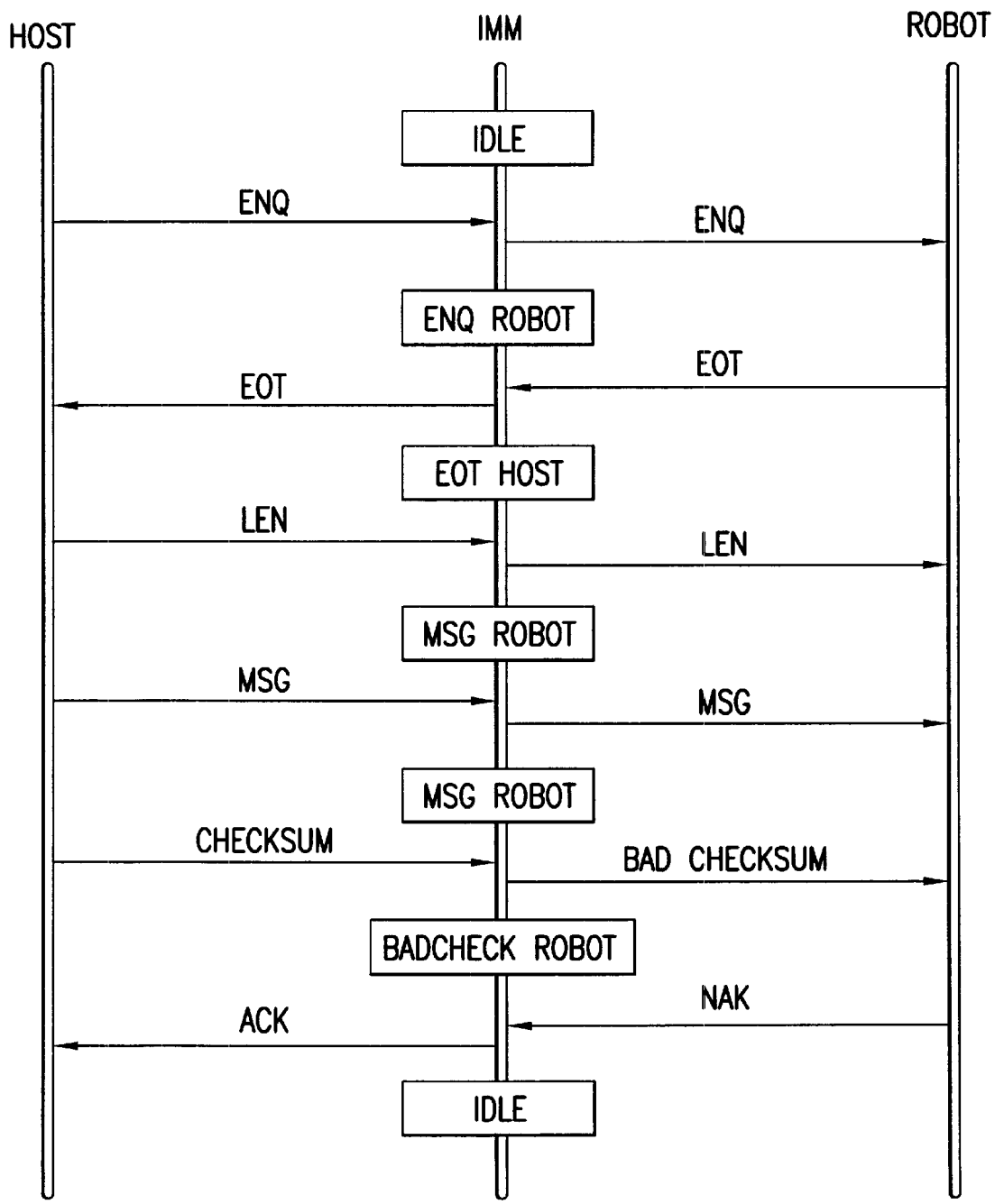
FIG. 9 shows the message traffic for a host to the module scenario.

The decision to forward the message a byte at a time, however, introduces a problem: when the host sends a material ID request, how can the IMM know not to send it on to the robot, until it has already sent most of it? The solution used in the IMM is to send the message on to the robot, as normal, but to change the final byte of the checksum to an incorrect value, see FIG. 9.

Note again the contention resolution (state ENQ_robot transitions to ENQ_host upon receiving an ENQ from the robot), and the fact that all timeouts return to an IDLE state.

Figure 11:
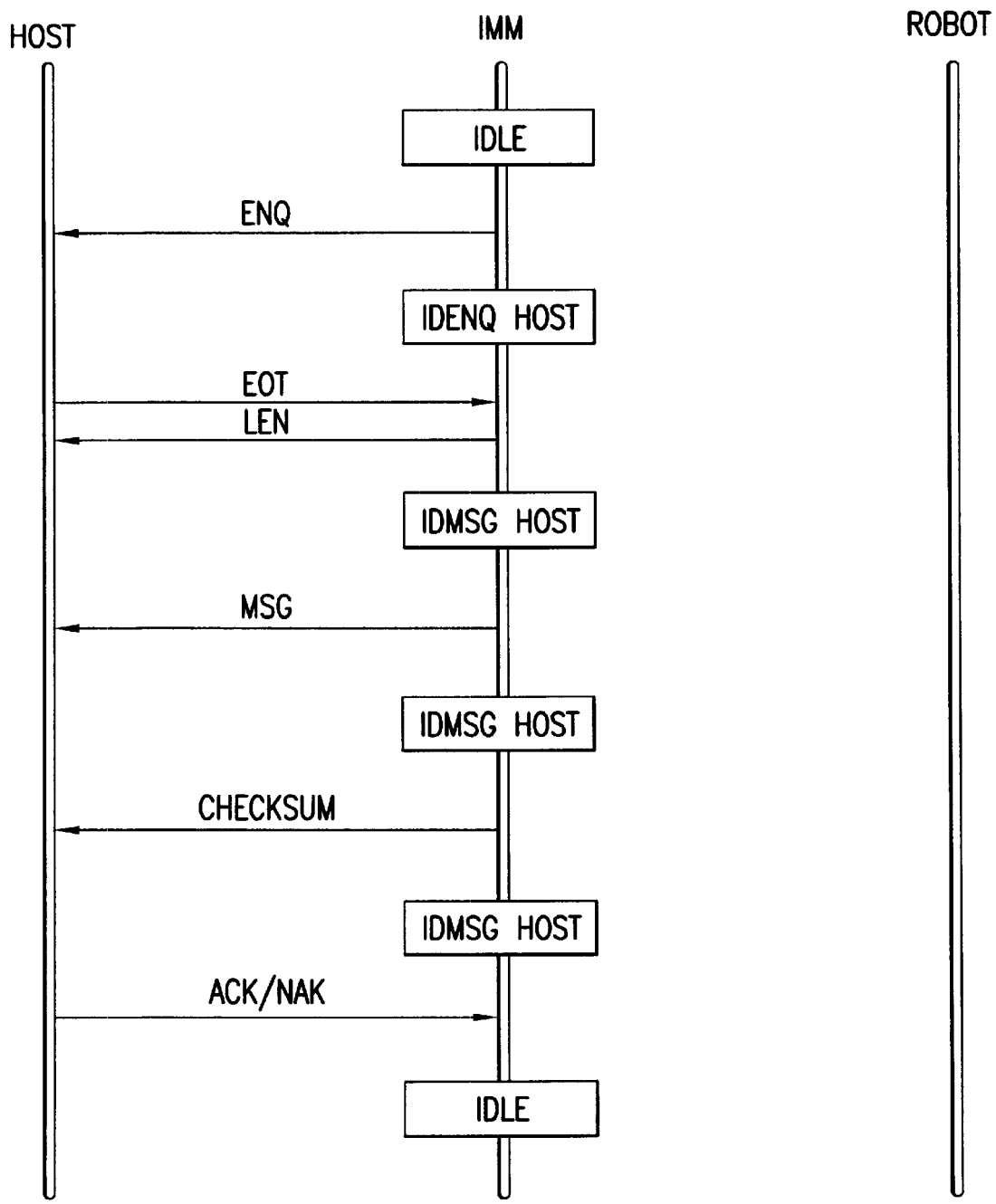
FIG. 11 shows the message traffic for the module to host scenario.

Message from IMM Finally, consider how the IMM sends a message ID reply to the host. This is a simple SECS-I sequence, shown in FIG. 11.

The robot will behave as if the message has been corrupted, send back a NAK, and take no further action. The IMM, however, is aware that the message has been received correctly, and returns an ACK to the host. Note that if the message is corrupted in any way, say with a bad checksum, it will not be recognized by the IMM as a material ID request and it will be passed on through to the robot, where it will be treated as any other unrecognized message. This whole approach relies on the robot's ability to reject corrupted messages, of course, but since that is a basic part of the SECS-I standard, the approach works reliably.

Figure 10:
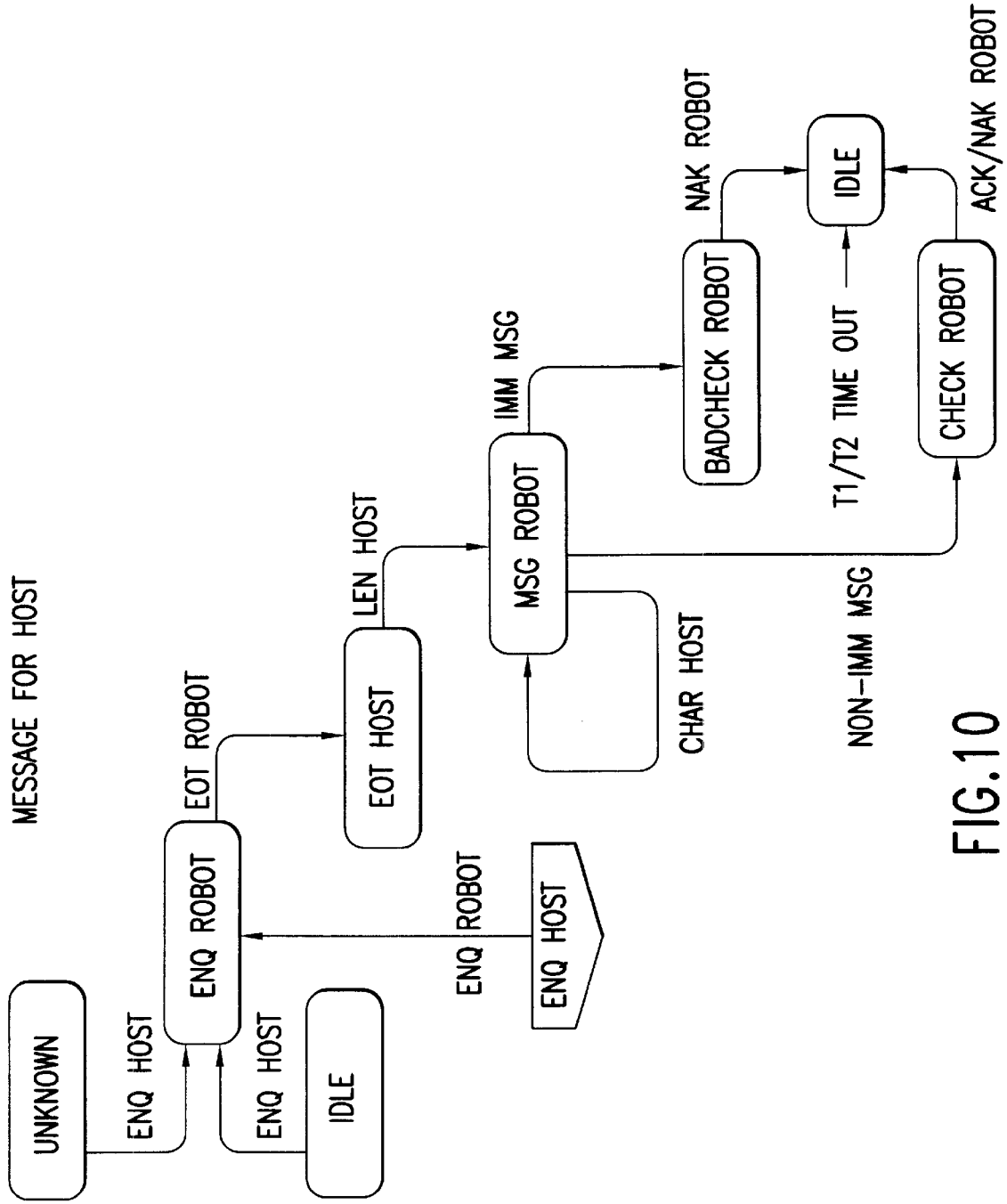
FIG. 10 is the state diagram associated with a message from the host.
Figure 12:
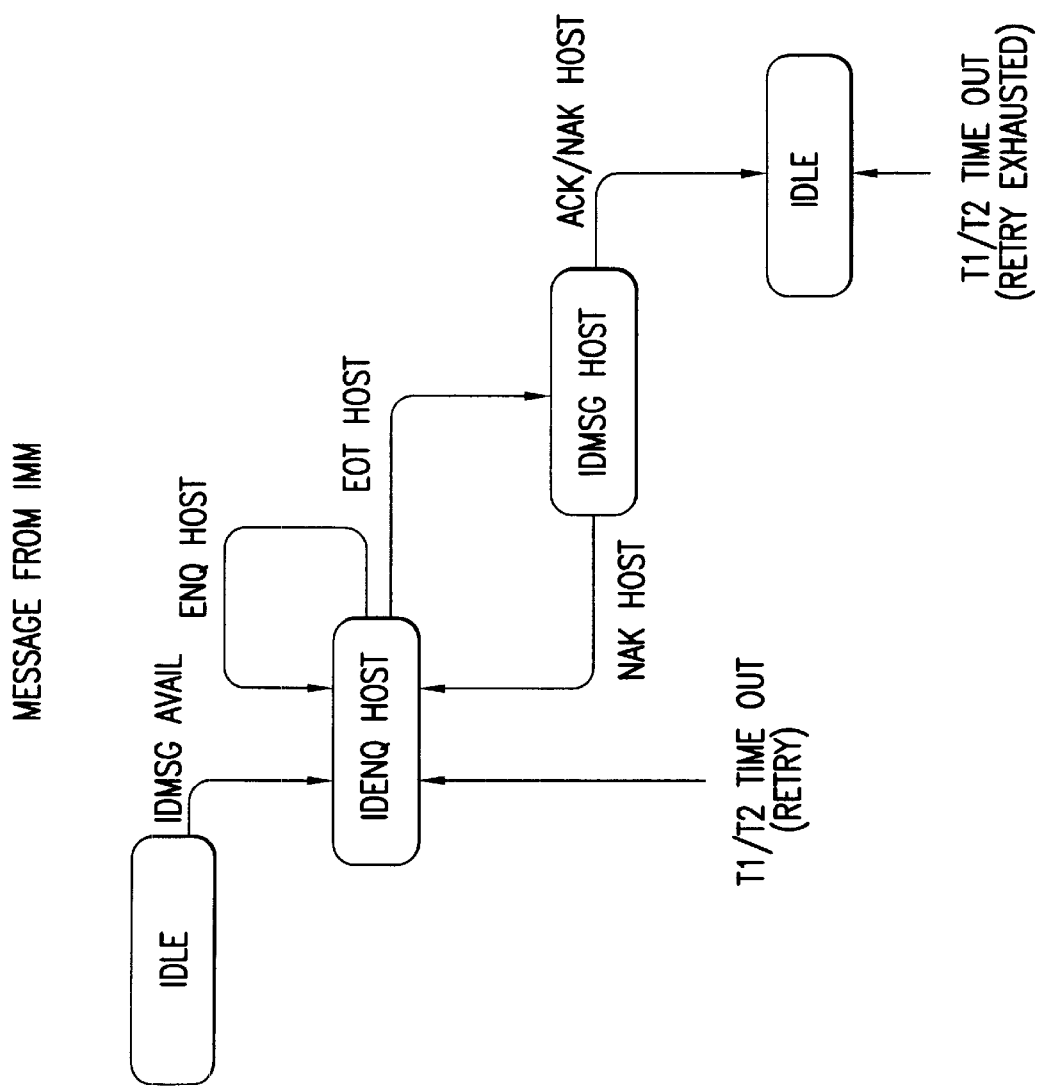
FIG. 12 is the state diagram associated with a message from the module.

A state diagram that is associated with both these sequences is shown in FIG. 10. Characters arriving from the robot are ignored until the message has been sent and acknowledged. Since under normal circumstances this only takes a couple of dozen milliseconds (the message is ten characters long, and one character takes about a millisecond at 9600 baud), the robot only experiences a slight delay, considerably less than the T2 period that it will tolerate. If the host does not respond to the IMM message and a T2 timeout occurs, then the robot will experience a timeout, too, but that would probably have occurred if the IMM had been busy sending a message anyhow. The state diagram associated with this sequence is shown in FIG. 12.

Note that the IMM will try to re-send the material ID reply if the host fails to acknowledge it the first time. The number of retry attempts, however, currently defaults to 0, in agreement with the current robot SECS interface definition. In this configuration, all timeouts return the IMM to an IDLE state.

5. Communication Control for ASCII Interface

Figure 13:
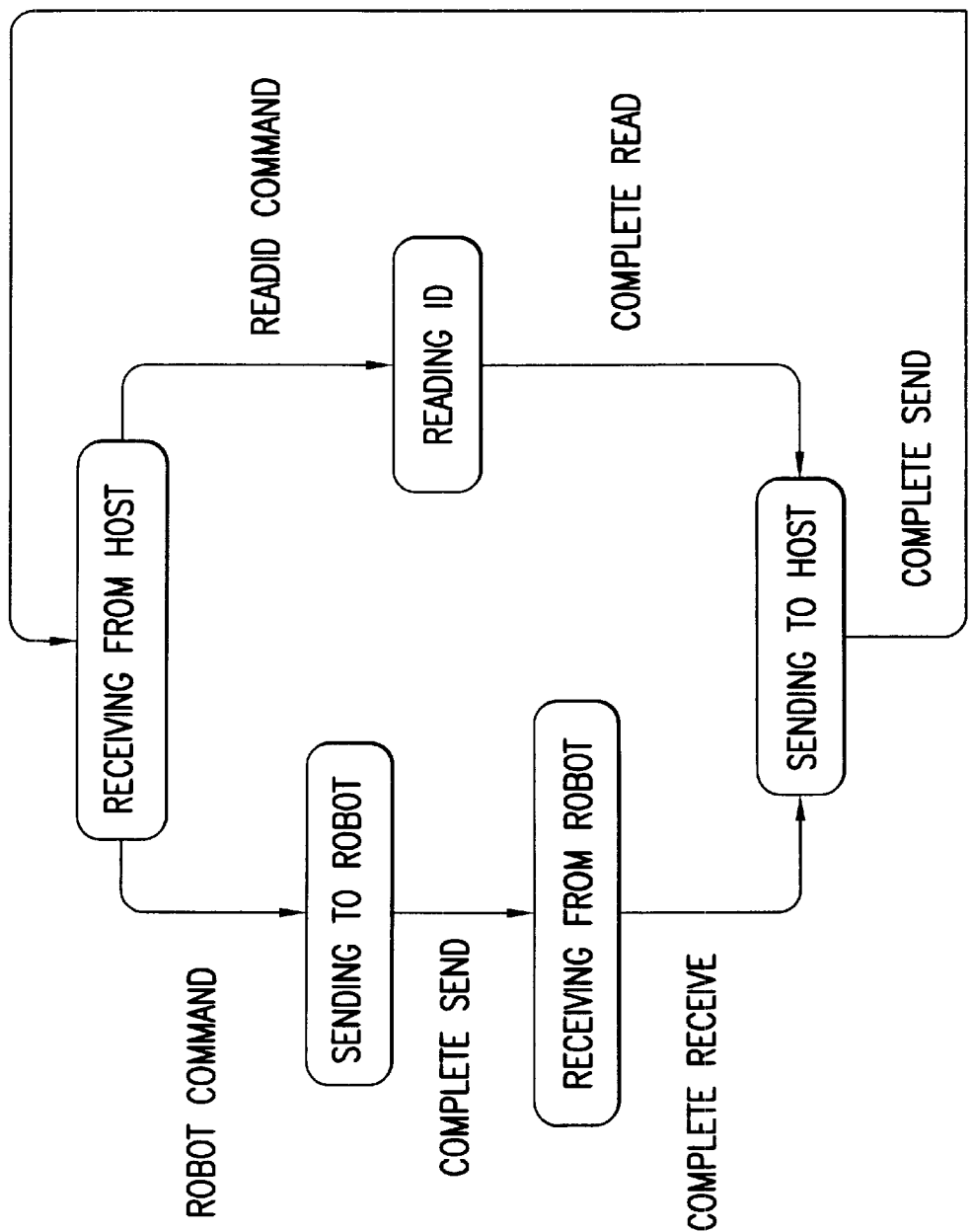
FIG. 13 is the state diagram associated with an ASCII interface.

The module is responsible for the coordination of all communication with the external devices—the host, the robot, the ID system—or the ASCII message protocol configuration. It registers itself during initialization as the handler for all communication with the robot and host serial ports, and it communicates with the ID system through the ID read interface. Like the SECS communication control it implements a finite state machine, but because it reads and buffers an entire message at every step and does not deal with it a character at a timer, the state machine is less complicated, see FIG. 13.

After initialization, the module waits to receive a message in the RECEIVING_FROM-HOST state. The receiveHost routine saves the incoming character sequence in a buffer, and upon receiving a or it inspects the message and proceeds to the next step. If the message is a normal robot command, not a material id message, enters the SENDING_TO_ROBOT state and starts transmitting the message to the robot serial port. When sendRobot has sent the message, it waits for the robot to send a reply in the RECEIVING_FROM_ROBOT state. When an entire message has been received from the robot, receiveRobot enters the SENDING_TO_HOST state and starts transmitting the message on the host serial port. When the message has been sent, sendHost returns to the RECEIVING_FROM_HOST state and begins the cycle again.

If the message is a material id request, "READID," the finite state machine enters the READING_ID state and initiates a read from the ID system. When the ID system completes the read, it signals the ASCII module by invoking the callback routine with the status and data. This routine formats a reply message and sends it to the host.

Notice that a character can arrive from either source, ROBOT or HOST, at any time, and the ASCII module must be prepared to deal with unexpected input. This is particularly simple, for there is exactly one event associated with each state, and one handler for each event. Thus the routines just checks to see that the module is in the state for which they are expected to be active, and if they are invoked under other circumstances, they simply ignore the input and return.

There is a safety net built in to the ASCII module to help it avoid getting locked up. If, for instance, the terminating in a command should get lost or garbled, the module could wait forever for a message to complete. This is done by running the watchdog timer in the background, and clearing it whenever the module completes a cycle and reenters the RECEIVING_FROM_HOST state. Since we don't want the watchdog to go off just because a message hasn't arrived for a while, though, we also use the millisecond timer facility to periodically run a timeout routine, which clears the watchdog if we are just idle with an empty buffer.

What is claimed is:

1. A system for processing articles, which system includes a plurality of machine tools for processing articles, a pod for carrying the articles to be processed by said machine tools from one machine tool to another, a host processing controller associated with said machine tools for controlling the operation thereof, each said machine tool having a robot for receiving said pod, opening said pod and for transporting the articles from within said pod into position on said machine tool for processing, and an identification reader carried by said pod for identifying a particular pod and the articles carried therein, said system including a module comprising:

a module controller;

a first communication connection between said host processing controller and said module controller;

a second communication connection between said module controller and said robot; and a third communication connection coupled to said module controller and adapted to communicate with said identification reader;

wherein said module controller routes messages between said host processing controller and said robot over said first and second communication connection; and wherein said module controller is further adapted to read a material identification by communicating with said identification reader over said third communication connection when said module controller intercepts a material identification message from said host processing controller over said first communication connection.

2. The system according to claim 1 wherein the module further comprises a reader connected to said third communication connection for reading said identification reader when said pod is placed on said machine tool.

3. The system according to claim 2 wherein said identification reader has an RF transmitter and said reader connected to said third communication connection comprises an RF receiver.

4. The system according to claim 2 wherein said identification reader has an infrared transmitter and said reader connected to said third communication connection comprises an infrared receiver.

5. The system according to claim 2 wherein said identification reader is a barcode and said reader connected to said third communication connection comprises an optical character reader.

6. The system according to claim 2 further comprising detecting means mounted on said machine tool for detecting the presence of said pod, said detecting means connected with said host controller, whereby when said host controller receives a message from said detecting means that a pod is in place for processing on said machine tool said host controller will issue a command to said reader to identify said pod by reading its identification means.

7. The system according to claim 6 wherein the module further comprises a power source and a power regulator for providing power to said module controller and to said reader.

8. The system of claim 1 wherein said module controller is further adapted to selectively communicate with either an RF identification reader, an infrared identification reader or a barcode identification reader.

9. A system for processing articles, the system comprising:
   a module controller;
   a first communication connection between a host processing controller and the module controller;
   a second communication connection between the module controller and a robot; and
   a third communication connection connected between the module controller and a material identification system;
   wherein the module controller is adapted to route messages between the host processing controller and the robot over the first and second communication connection and wherein the module controller is further adapted to read a material identification by communicating with the identification system over the third communication connection when the module controller receives a material identification message from the host processing controller over the first communication connection.

10. The system of claim 9 wherein the module controller is further adapted to selectively communicate with either a RF identification system, an infrared identification system or a barcode identification system.

11. The system according to claim 10 wherein the identification system has an RF transmitter and a reader comprising an RF receiver.

12. The system according to claim 10 wherein the identification system has an infrared transmitter and a reader comprising an infrared receiver.

13. The system according to claim 10 wherein the identification system has a barcode and a reader comprising a barcode reader.

14. The system according to claim 9 wherein the identification system has an RF transmitter and a reader comprising an RF receiver.

15. The system according to claim 9 wherein the identification system has an infrared transmitter and a reader comprising an infrared receiver.

16. The system according to claim 9 wherein the identification system has a barcode and a reader comprising a barcode reader.

17. A method of communicating with a host processing controller comprising the steps of:
   providing a module controller;
   connecting a first communication connection between a host processing controller and the module controller;
   connecting a second communication connection between the module controller and a robot;
   connecting a third communication connection between the module controller and a material identification system;
   routing messages with the module controller between the host processing controller and the robot over the first and second communication connection;
   intercepting a material identification message from the host processing controller over the first communication connection with the module controller; and
   reading a material identification by communicating with the identification system over the third communication connection.

* * * * *